United States Patent
Treibergs et al.

(10) Patent No.: US 9,875,954 B2
(45) Date of Patent: Jan. 23, 2018

(54) TEST SOCKET ASSEMBLY AND RELATED METHODS

(71) Applicant: XCERRA CORPORATION, Norwood, MA (US)

(72) Inventors: Valts Treibergs, White Bear Township, MN (US); Mitchell Nelson, St. Paul, MN (US); Jason Mroczkowski, Hudson, WI (US)

(73) Assignee: Xcerra Corporation, Norwood, MA (US)

( * ) Notice: Subject to any disclaimer, the term of this patent is extended or adjusted under 35 U.S.C. 154(b) by 147 days.

(21) Appl. No.: 14/743,879

(22) Filed: Jun. 18, 2015

(65) Prior Publication Data
US 2015/0369840 A1 Dec. 24, 2015

Related U.S. Application Data

(60) Provisional application No. 62/015,180, filed on Jun. 20, 2014.

(51) Int. Cl.
| | | |
|---|---|---|
| *G01R 31/00* | (2006.01) | |
| *H01L 23/495* | (2006.01) | |
| *H05K 5/04* | (2006.01) | |
| *H05K 7/10* | (2006.01) | |
| *G01R 1/04* | (2006.01) | |

(52) U.S. Cl.
CPC ...... *H01L 23/49517* (2013.01); *G01R 1/0483* (2013.01); *H05K 5/04* (2013.01); *H05K 7/10* (2013.01); *G01R 1/0466* (2013.01); *H01L 2924/0002* (2013.01)

(58) Field of Classification Search
CPC . G01R 1/067; G01R 1/06716; G01R 1/06722
See application file for complete search history.

(56) References Cited

U.S. PATENT DOCUMENTS

| | | | |
|---|---|---|---|
| 4,554,505 | A | 11/1985 | Zachry |
| 4,894,612 | A | 1/1990 | Drake et al. |
| 5,426,405 | A | 6/1995 | Miller et al. |
| 5,729,147 | A | 3/1998 | Schaff |
| 6,064,218 | A | 5/2000 | Godfrey et al. |

(Continued)

FOREIGN PATENT DOCUMENTS

EP      1510826 A1      3/2005

OTHER PUBLICATIONS

Berg, "Multi-GHz elastomeric connectors for complex hybrids and chip carriers", XP010089431—May 22, 1989; May 22, 1989—1989-524, pp. 50-70, May 22, 1989.

(Continued)

*Primary Examiner* — Tung X Nguyen
(74) *Attorney, Agent, or Firm* — Viksnins Harris Padys Malen LLP

(57) ABSTRACT

A socket assembly including a housing that has one or more spring probes therein. The socket assembly further includes a leadframe assembly that has one or more cantilever members, and the leadframe assembly has microwave structures and a flexible ground plane. The socket assembly further includes an elastomeric spacer adjacent the leadframe assembly, the elastomeric spacer having one or more holes receiving the spring probes therethrough.

22 Claims, 14 Drawing Sheets

(56) References Cited

U.S. PATENT DOCUMENTS

| | | | |
|---|---|---|---|
| 6,448,803 B1* | 9/2002 | Chung | G01R 1/0408 |
| | | | 324/756.02 |
| 6,512,389 B1 | 1/2003 | Kocher | |
| 6,930,498 B2 | 8/2005 | Tervo et al. | |
| 7,173,442 B2 | 2/2007 | Treibergs et al. | |
| 8,274,307 B1* | 9/2012 | Ben Artsi | H01P 3/026 |
| | | | 326/30 |
| 2005/0077905 A1 | 4/2005 | Sasaki, et al. | |
| 2006/0202110 A1* | 9/2006 | Karlquist | G01R 23/175 |
| | | | 250/227.12 |
| 2007/0269999 A1 | 11/2007 | Di Stefano | |

OTHER PUBLICATIONS

Patent Cooperation Treaty, International Searching Authority, Search Report and Written Opinion for PCT/US2015/036513, 10 pages, Sep. 22, 2015.

* cited by examiner

CONTACT FINGER- DEFLECTED

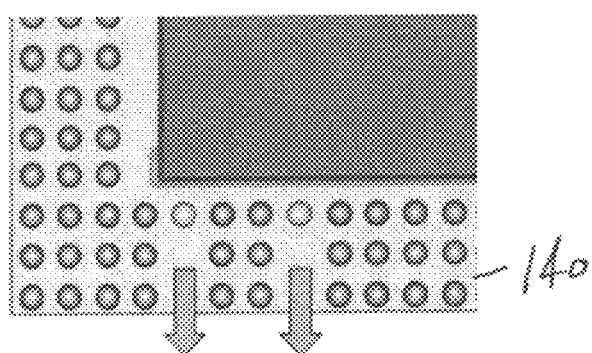
FIG. 8
FIG. 9
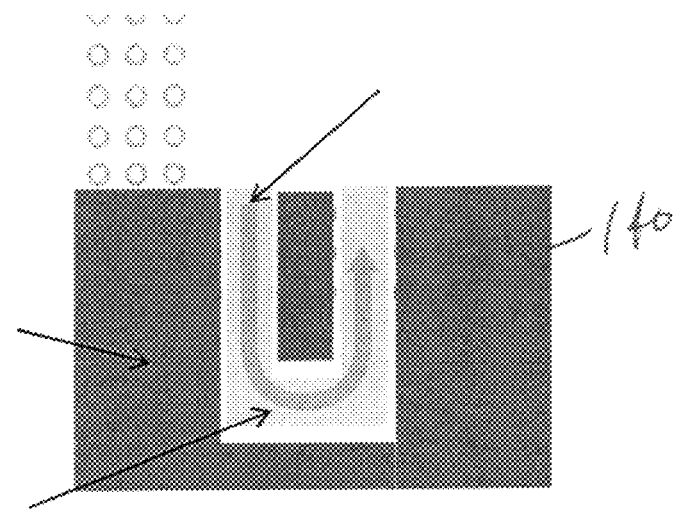

FIG. 11A – FIG. 11G
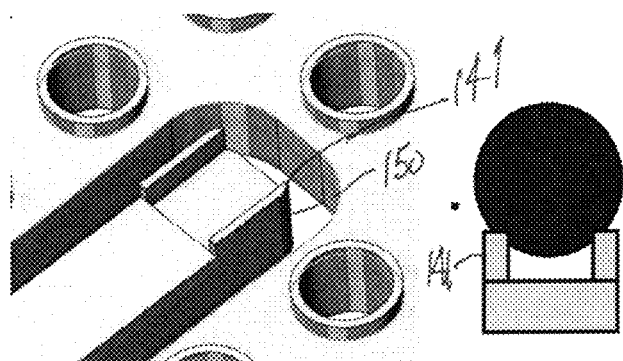
FIG. 11A
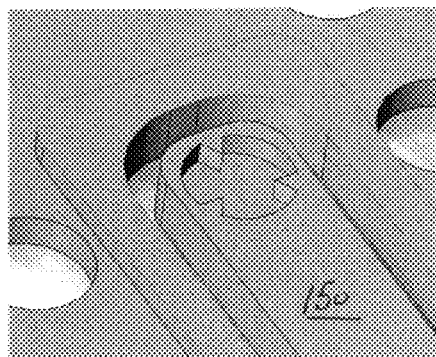
FIG. 11B
FIG. 11C
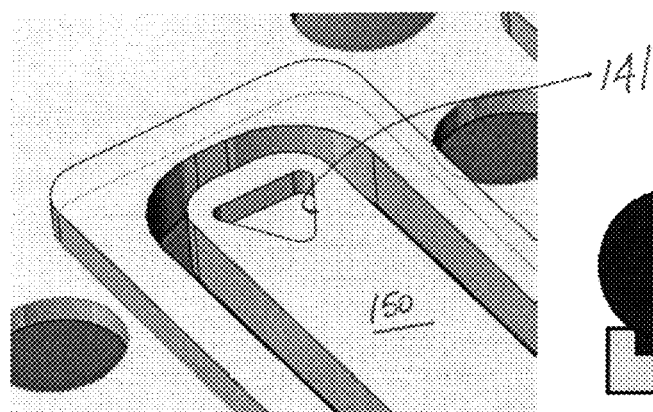
FIG. 11D
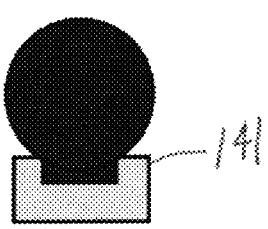
FIG. 11E
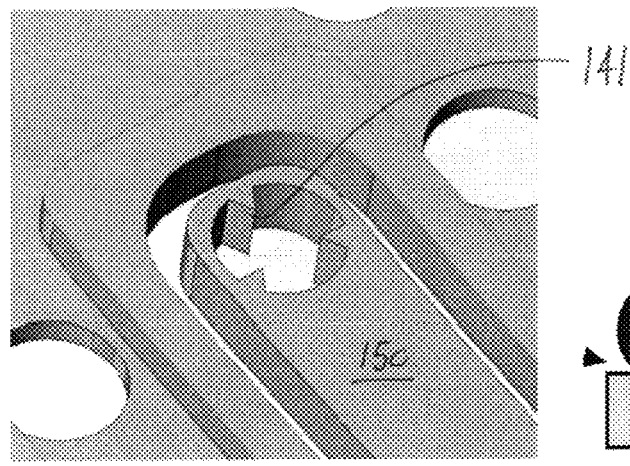
FIG. 11F
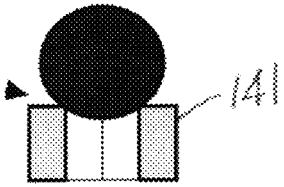
FIG. 11G

TEST SOCKET ASSEMBLY AND RELATED METHODS

RELATED APPLICATION

This application claims priority to U.S. Provisional Patent Application No. 62/015,180, filed Jun. 20, 2014, the entirety of which is incorporated herein by reference.

TECHNICAL FIELD

Test contactor mounting assemblies and related methods.

TECHNICAL BACKGROUND

Test contactors are used on printed circuit boards to test various parameters and/or components of semiconductor devices. Electronic devices have become smaller yet more powerful, resulting crowded and complex circuit boards. For example, modern automobiles are using RADAR equipment for collision avoidance, parking assist, automated driving, cruise control, etc. The radio frequencies used in such systems are typically 77 GHz (W-band). Next generation IC's will push operating frequencies to even higher levels. Semiconductor devices that operate at these frequencies need to be tested, but existing test contactor technology cannot operate in the W-band due to extreme transmission line impedance mismatches.

SUMMARY

A socket assembly including a housing that has one or more spring probes therein. The socket assembly further includes a leadframe assembly that has one or more cantilever members, and the leadframe assembly has microwave structures, and a flexible ground plane. The socket assembly further includes an elastomeric spacer adjacent the leadframe assembly, the elastomeric spacer having one or more holes receiving the spring probes therethrough.

In one or more embodiments, a method includes disposing a device under test in a socket assembly, the socket assembly comprising a housing having one or more spring probes therein, a leadframe assembly including one or more cantilever members, the leadframe assembly having impedance controlled microwave structures and a flexible ground plane, the leadframe assembly disposed within the housing, and an elastomeric spacer adjacent the leadframe assembly, the elastomeric spacer having one or more holes receiving the spring probes therethrough. The method further includes contacting the device under test with the spring probes and the microwave structures, and contacting the device under test with the cantilever members and flexing and deflecting the cantilever members.

These and other embodiments, aspects, advantages, and features of the present invention will be set forth in part in the description which follows, and will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

BRIEF DESCRIPTION OF THE FIGURES

FIG. 8 illustrates a top view of a portion of a device under test as constructed in one or more embodiments.

FIG. 9 illustrates a top view of a portion of a leadframe assembly as constructed in one or more embodiments.

FIG. 11A illustrates a perspective view of a cantilever member of the leadframe assembly as constructed in one or more embodiments.

FIG. 11B illustrates a cross-sectional view of a cantilever member of the leadframe assembly as constructed in one or more embodiments.

FIG. 11C illustrates a perspective view of a cantilever member of the leadframe assembly as constructed in one or more embodiments.

FIG. 11D illustrates a perspective view of a cantilever member of the leadframe assembly as constructed in one or more embodiments.

FIG. 11E illustrates a cross-sectional view of a cantilever member of the leadframe assembly as constructed in one or more embodiments.

FIG. 11F illustrates a perspective view of a cantilever member of the leadframe assembly as constructed in one or more embodiments.

FIG. 11G illustrates a cross-sectional view of a cantilever member of the leadframe assembly as constructed in one or more embodiments.

DETAILED DESCRIPTION

The following detailed description includes references to the accompanying drawings, which form a part of the detailed description. The drawings show, by way of illustration, specific embodiments in which the apparatus may be practiced. These embodiments, which are also referred to herein as "examples" or "options," are described in enough detail to enable those skilled in the art to practice the present embodiments. The embodiments may be combined, other embodiments may be utilized or structural or logical changes may be made without departing from the scope of the invention. The following detailed description is, therefore, not to be taken in a limiting sense and the scope of the invention is defined by the appended claims and their legal equivalents.

In this document, the terms "a" or "an" are used to include one or more than one, and the term "or" is used to refer to a nonexclusive "or" unless otherwise indicated. In addition, it is to be understood that the phraseology or terminology employed herein, and not otherwise defined, is for the purpose of description only and not of limitation.

Figure 1:
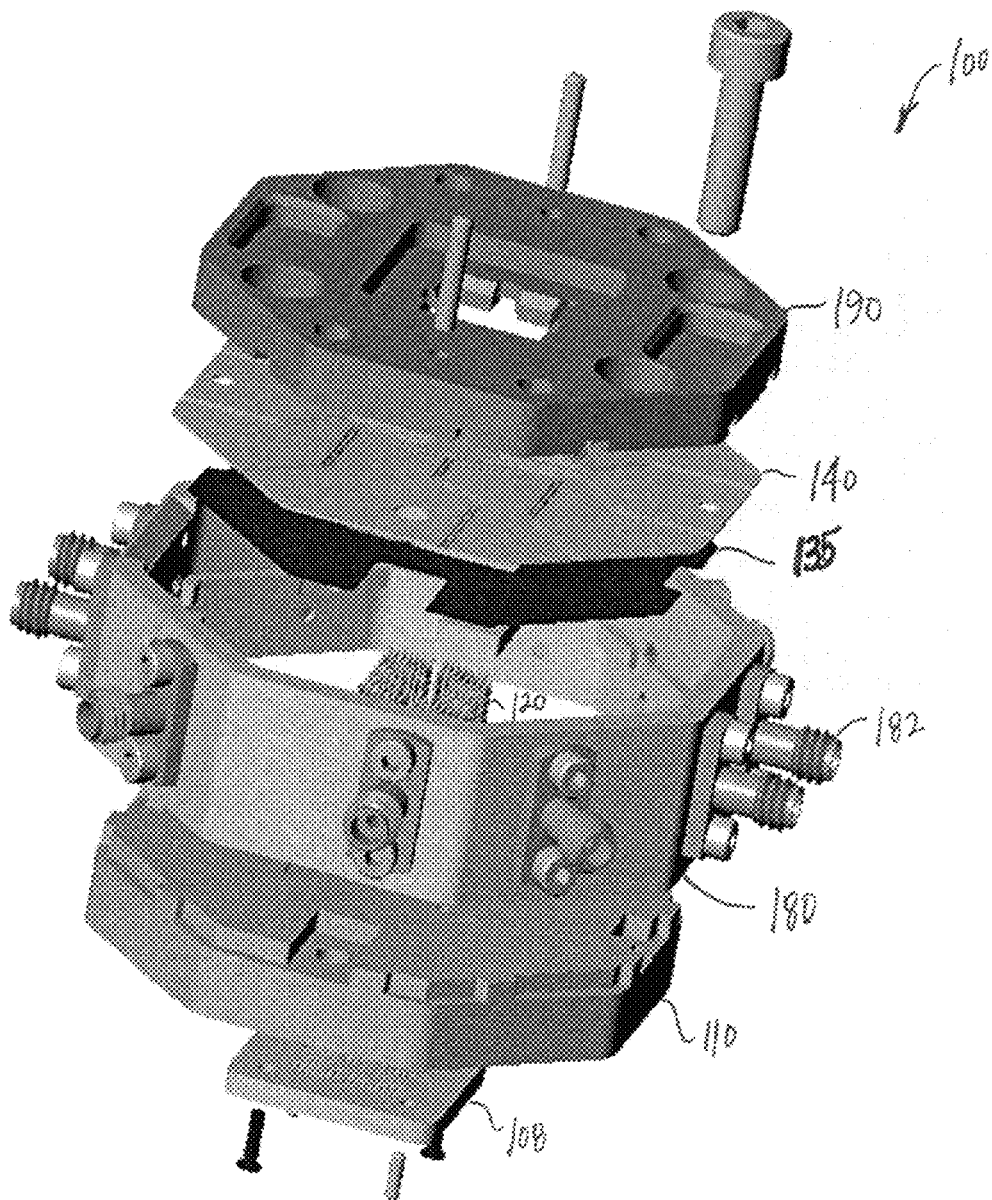
FIG. 1 illustrates an exploded perspective view of a test socket assembly as constructed in one or more embodiments.
Figure 2:
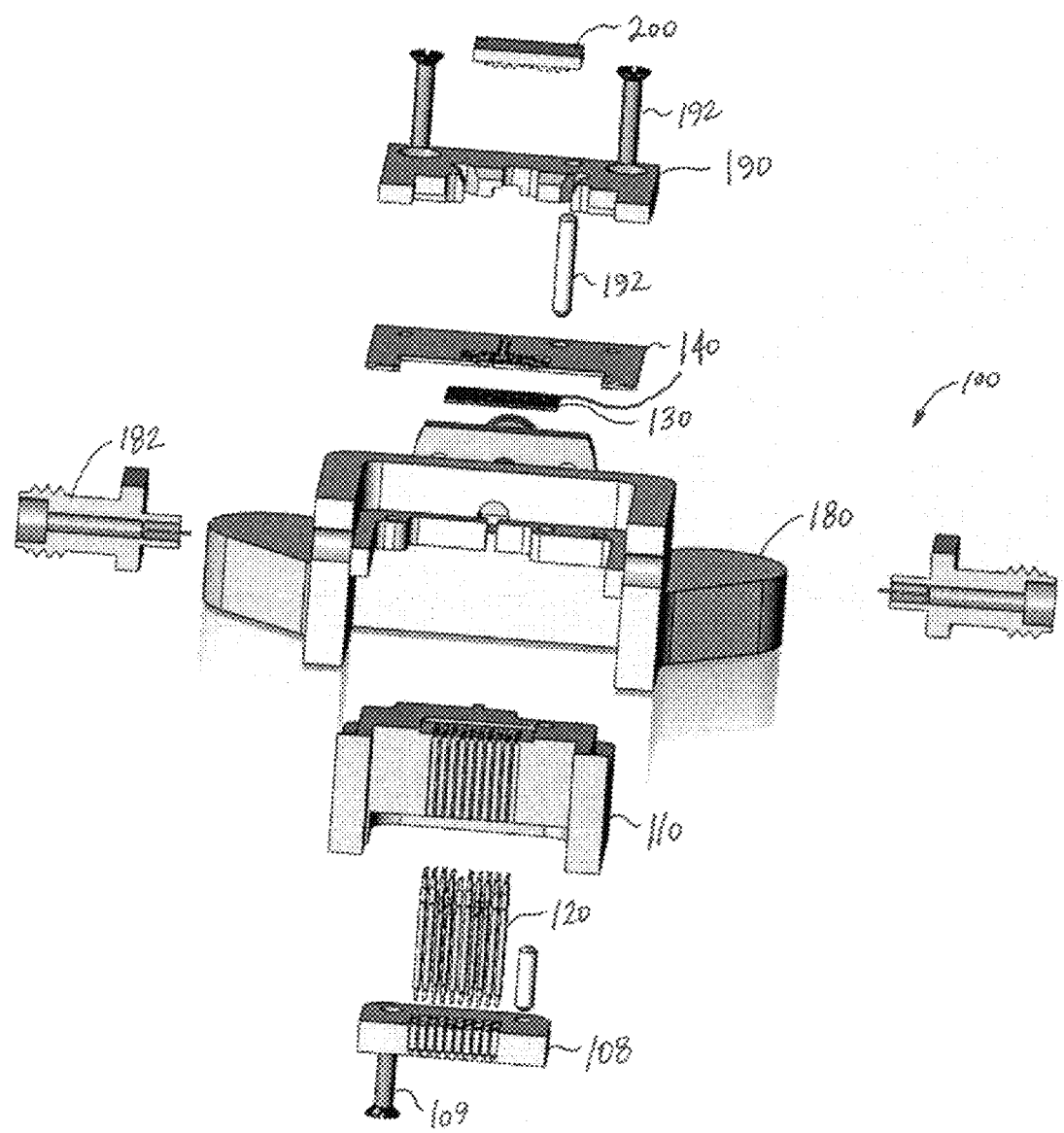
FIG. 2 illustrates an exploded cross-sectional view of a test socket assembly as constructed in one or more embodiments.
Figure 3:
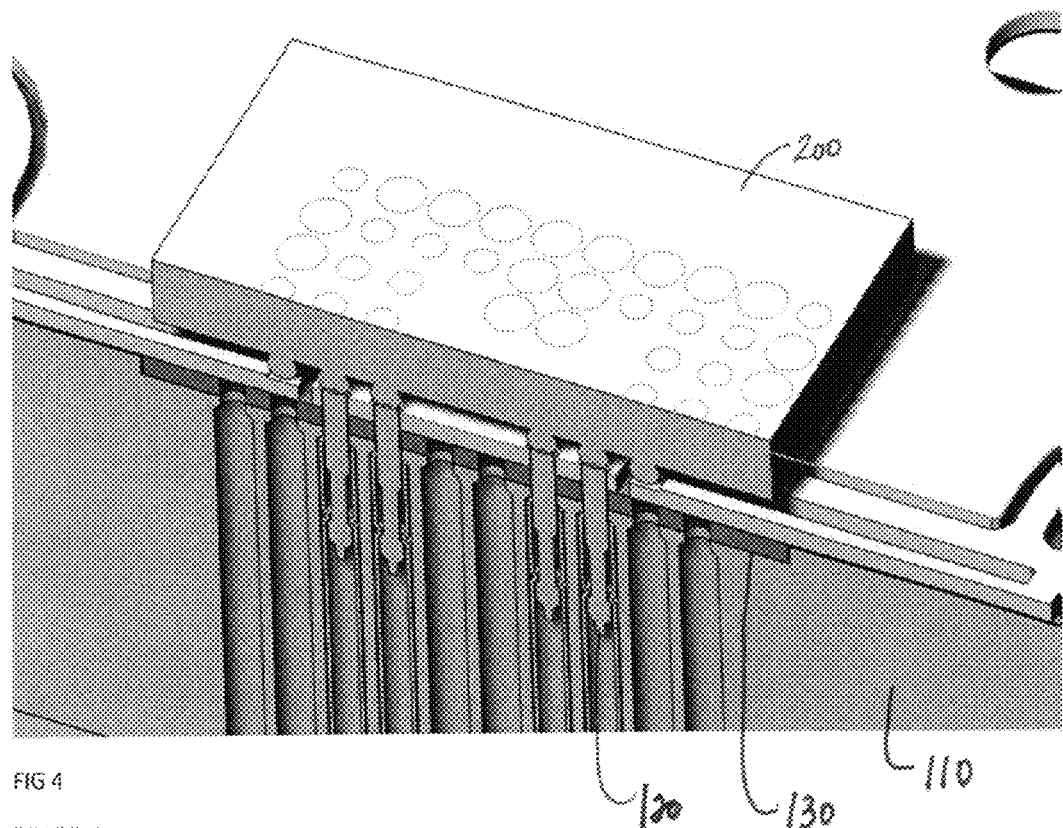
FIG. 3 illustrates a perspective view of a portion of a test socket assembly as constructed in one or more embodiments.
Figure 4:
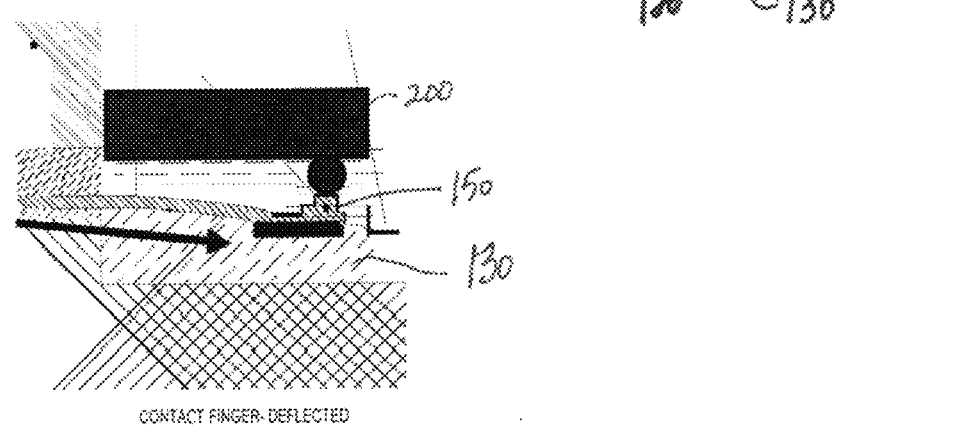
FIG. 4 illustrates a cross-sectional view of a test socket assembly as constructed in one or more embodiments.

FIGS. 1 and 2 illustrate a test socket assembly 100, including a socket alignment frame 190, a leadframe assembly 140, spring probes 120, a socket frame 180, a socket body 110, and a retainer plate 108. The test socket assembly 100 is an integrated circuit test socket that combines spring probes in an insulative housing with a conductive structure that includes a flexible ground plane and impedance controlled microwave structures that carry very high speed signals in coplanar waveguide structures and coaxial connectors that interface with test equipment. Retainer plate hardware 109 and alignment frame hardware 192 are also optionally provided.

The test socket assembly 100 is used with a device under test 200 (FIG. 2). The test socket assembly 100 uses vertical compliance to achieve reliability. The spring probes 120 are compliant for the power, ground and low speed signal connections, such as balls, and the microwave structures flex into the elastomer spacer 130. The microwave structures terminate in precision coaxial connectors or waveguides. Referring to FIG. 2, the socket alignment frame 190 assists in aligning the device under test 200 with the test socket assembly 100.

FIGS. 3-6 illustrate the leadframe assembly 140 in greater detail. The leadframe assembly 140, including polymer 135, is installed on the body 110 with spring probes 120 and an elastomer spacer 130, where the leadframe assembly 140 is adjacent to the elastomer spacer 130. For example the leadframe assembly 140 is positioned on top of the elastomer spacer 130, and in a further option positioned directly adjacent and directly on top of the spacer 130. The elastomer spacer 130 is disposed in a pocket in the plastic socket body 110. The elastomer spacer 130 provides resiliency to the ground and microwave structures. In one or more embodiments, the elastomer spacer 130 has one or more holes sizes and positioned to receive the spring probes 120 therethrough. In one or more embodiments, the elastomer spacer 130 is resilient so that the microwave structures and ground planes offer compliance. In one example, the spacer can be laser cut and customized to the pinout configuration of the device under test. The spacer can be made from a silicone rubber sheet.

The device under test 200 (FIGS. 2-4) engages both spring probes and ends of microwave structures. In one or more embodiments, the leadframe assembly 140 is replaceable such that it can be removed from the socket assembly without damaging the socket assembly and replaced with another leadframe assembly.

The leadframe assembly 140 includes an electrically conductive sheet with holes, slots, and cantilever members 150 that make the impedance controlled microwave structures (such as a coplanar waveguide). Microwave structures are formed to high speed signal positions of the device under test, and are routed to the edge of the leadframe assembly 140 or to an interior position in the grounding portion of the leadframe. On a back side of the leadframe is a thin, flexible polymer 135, which can be attached with an adhesive, to maintain the shape and position of all of the individual leadframe parts. Other holes can be fabricated in the ground plane and can be used for mechanical fastening and/or alignment to the socket housing.

Figure 5A:
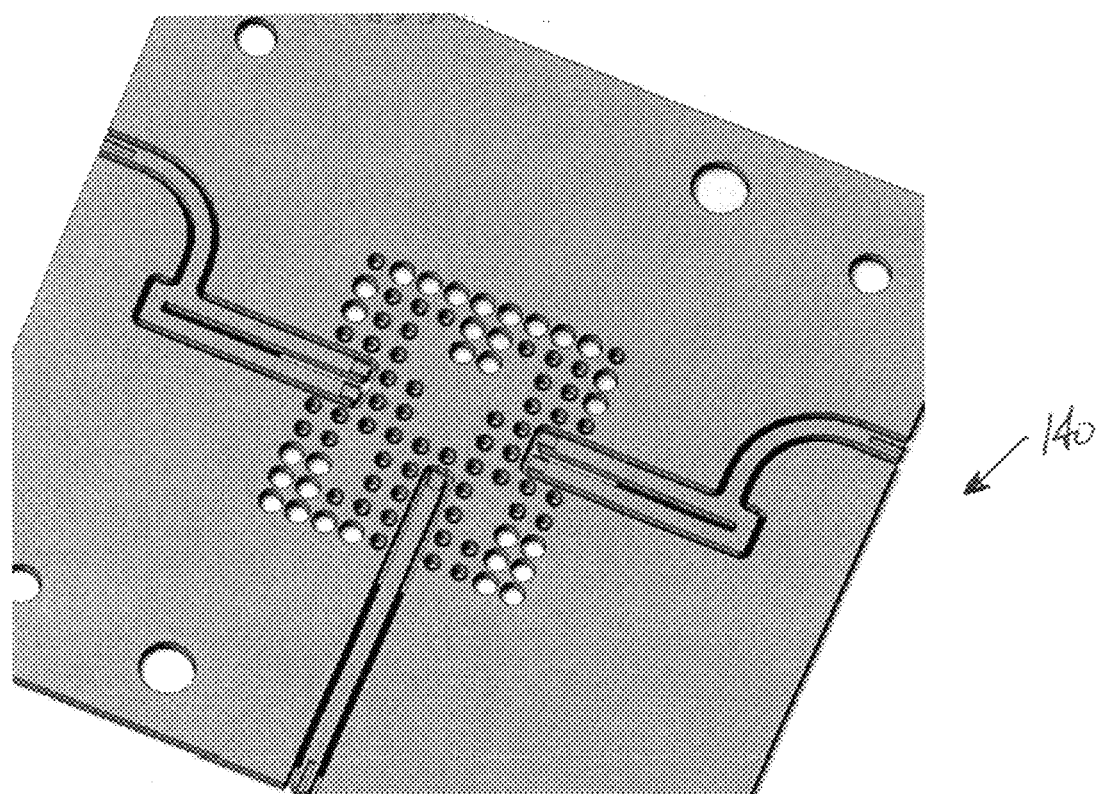
FIG. 5A illustrates a view of a leadframe assembly as constructed in one or more embodiments.
Figure 5B:
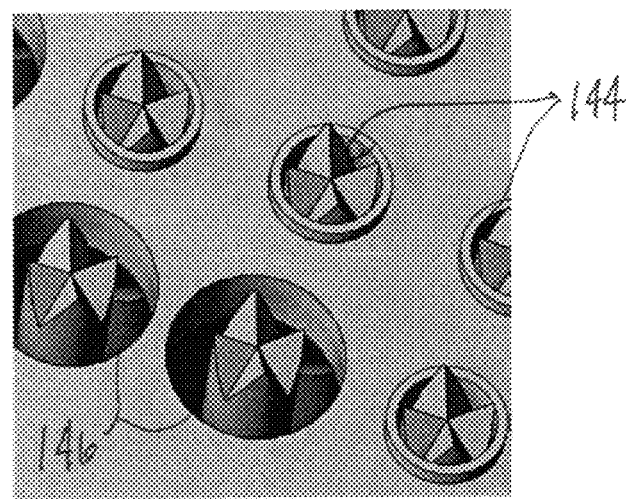
FIG. 5B illustrates a view of a portion of leadframe assembly as constructed in one or more embodiments.

In one or more embodiments, the leadframe assembly 140 has holes matched for the pin out array of the spring probes, as shown in FIGS. 5A and 5B. The lead frame has a first set of holes 144 that are tightly positioned where ground signals need to be in contact with the device under test and spring pin. For example, the leadframe assembly 140 makes electrical contact with the spring probes at the first set of holes 144. The leadframe assembly 140 further includes a second set of holes 146 which are oversized relative to the spring probe where non-critical signals interface with the device under test 200 (FIG. 2), such as power lines or other signal lines. For example, the spring probes do not make electrical contact with the leadframe assembly 140 at the second set of holes 146.

Figure 10:
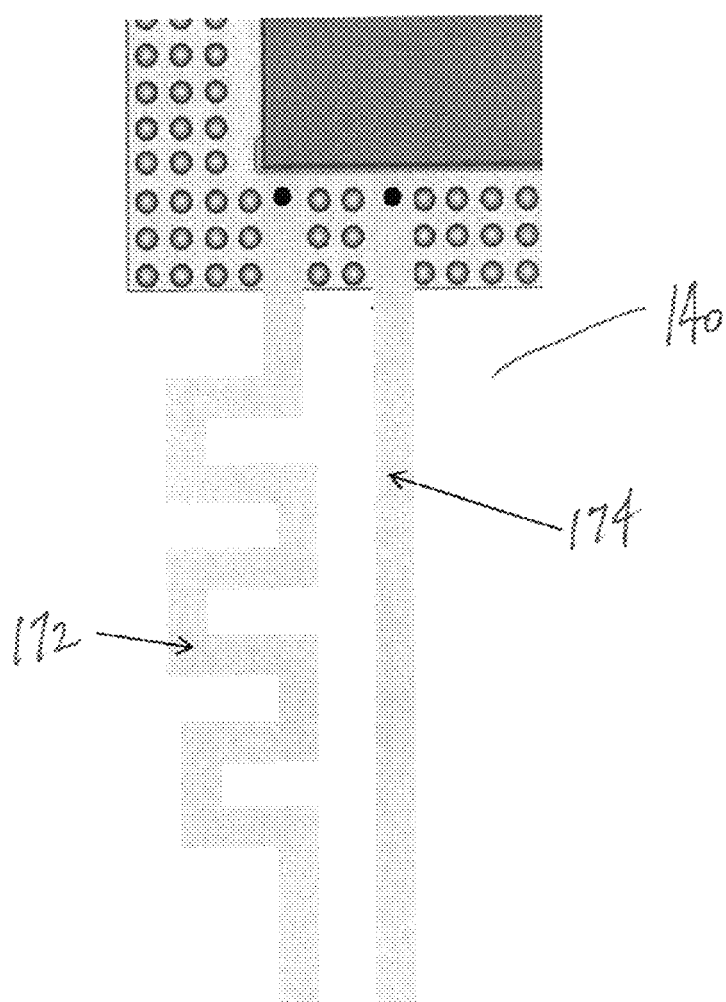
FIG. 10 illustrates a top view of a portion of a leadframe assembly as constructed in one or more embodiments.

FIG. 7-10 illustrates the leadframe assembly 140 in greater detail. In one or more embodiments, a flexible 2-D structure of the leadframe assembly 140 allows for other RF structures to be directly incorporated therein. For example, a balun structure 170 splits a single-ended 50 ohm signal at a specific frequency and shifts phase of the signals. One leg of the split is slightly longer, thus shifting the phase if the signal by a prescribed amount, for example 180 degrees (See FIG. 7). The resultant output is a balanced differential signal pair. Additional embodiments include, but are not limited to loopback traces connecting input and output signals, and delay lines (See FIGS. 8 and 9, 10). In one or more embodiments, as shown in FIG. 10, the leadframe assembly includes signal paths with longer 172 or shorter 174 paths to fine tune signal propagation delay.

The leadframe assembly 140 includes one or more cantilever members 150 which flex relative to the remaining portion of the assembly 140. The cantilever members 150 include members which interface with the device under test 200 (FIG. 2). The cantilever members 150 are impedance controlled microwave structures. The members include end portions of the cantilever members 150, in one or more examples. In one or more examples, as shown in FIG. 11A-FIG. 11G, the members 141 have mechanical structures designed to align and/or penetrate the ball grid array solder balls, which assist in making reliable electrical contacts. In one or more examples, the members include parallel edges (FIG. 11A, 11B), recessed overall triangle shape (FIG. 11C, 11E), recessed sharp bumps (FIG. 11D, 11E), a hole or opening with internal sharp features, such as projections (FIG. 11F, 11G), or a combination thereof. In one or more embodiments, the cantilever members include coupling members of the transmission line signals. In one or more embodiments, the coupling members are delay lines or phase shifting lines.

Figure 6:
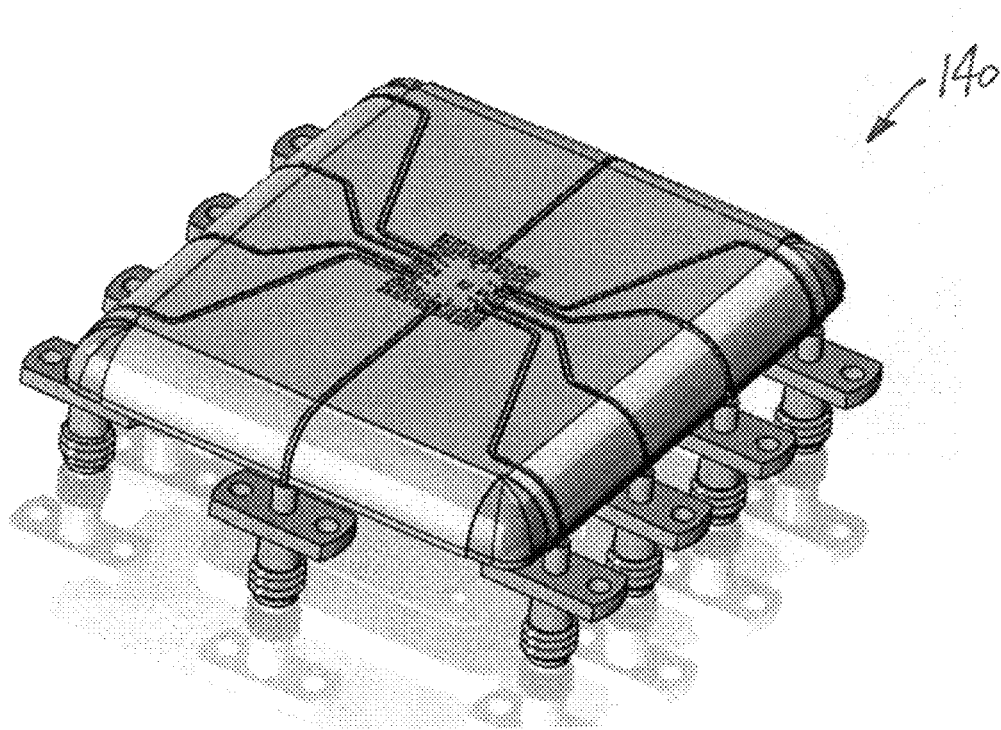
FIG. 6 illustrates a perspective view of a leadframe assembly as constructed in one or more embodiments.
Figure 7:
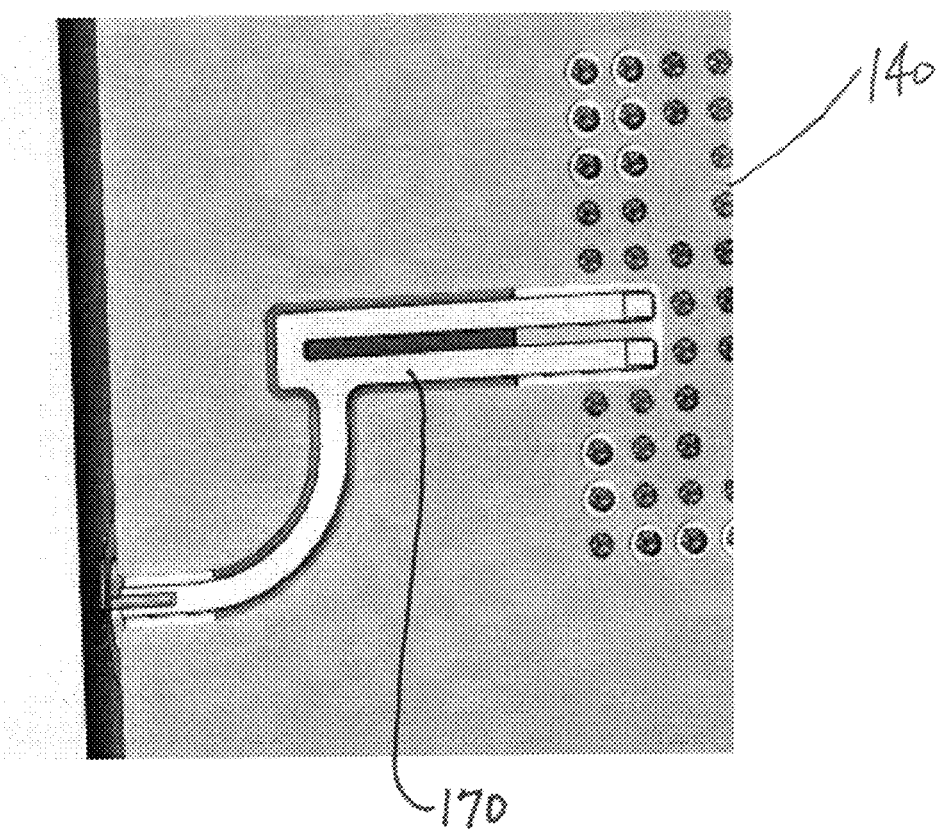
FIG. 7 illustrates a top view of a portion of a leadframe assembly as constructed in one or more embodiments.
Figure 12:
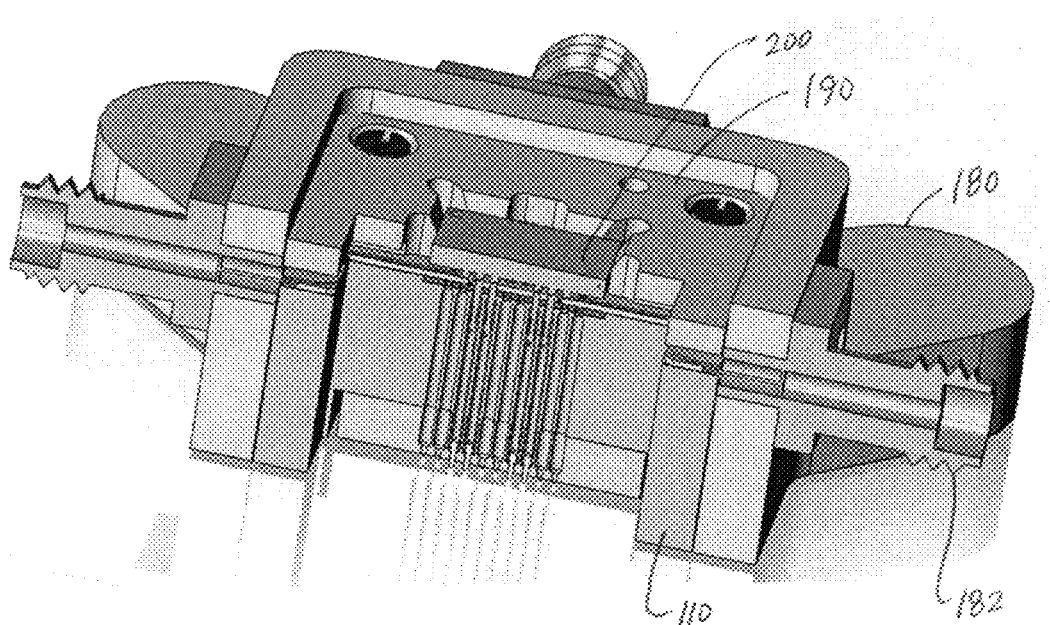
FIG. 12 illustrates a view of the contactor as constructed in one or more embodiments.
Figure 13A:
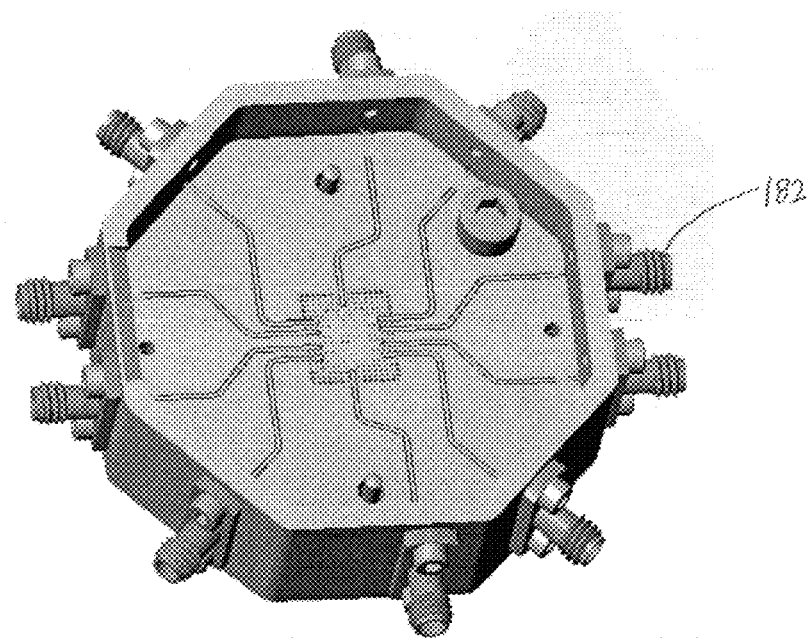
FIG. 13A illustrates a portion of a test socket assembly as constructed in one or more embodiments.
Figure 13B:
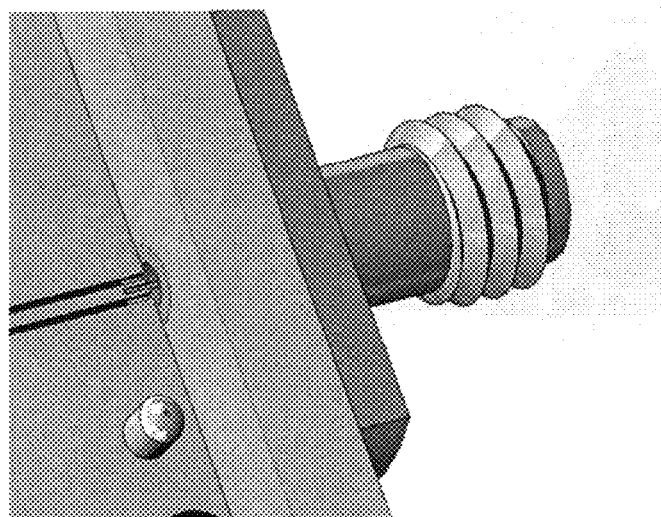
FIG. 13B illustrates a portion of a test socket assembly as constructed in one or more embodiments.
Figure 13C:
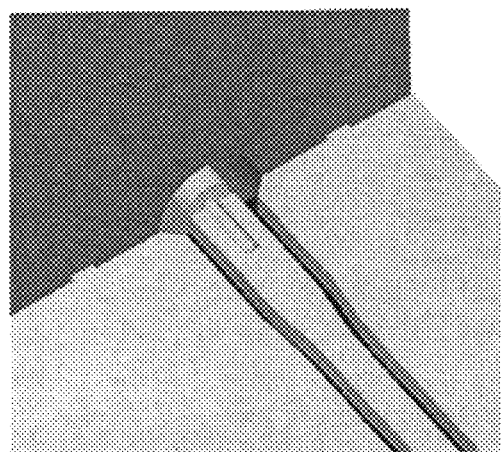
FIG. 13C illustrates a portion of a test socket assembly as constructed in one or more embodiments.
Figure 13D:
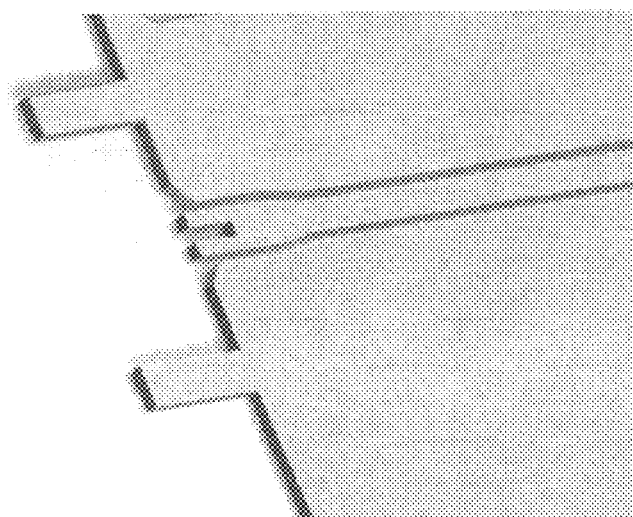
FIG. 13D illustrates a portion of a test socket assembly as constructed in one or more embodiments.
Figure 14:
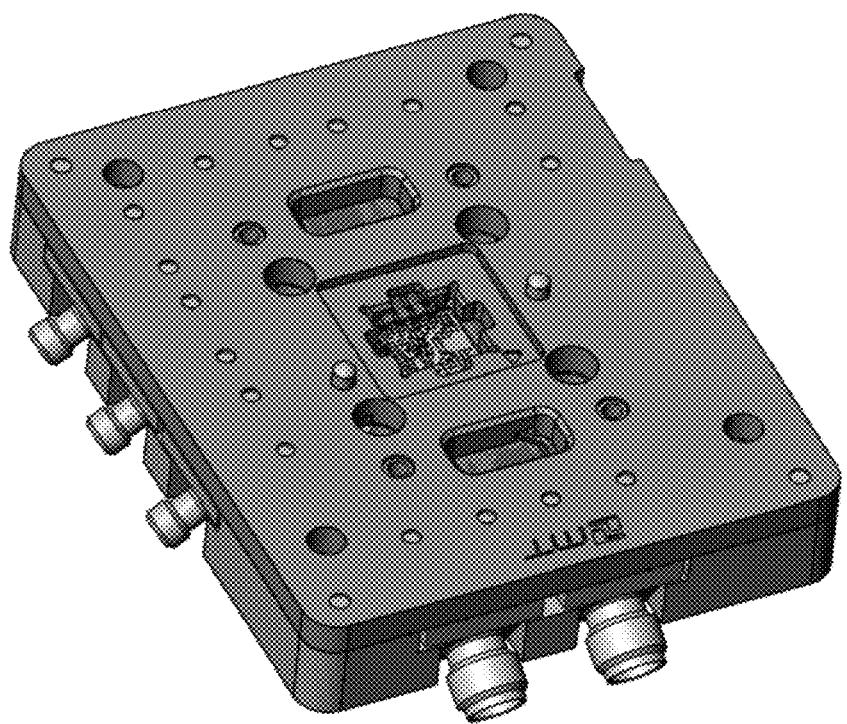
FIG. 14 illustrates a test socket assembly as constructed in one or more embodiments.
Figure 15:
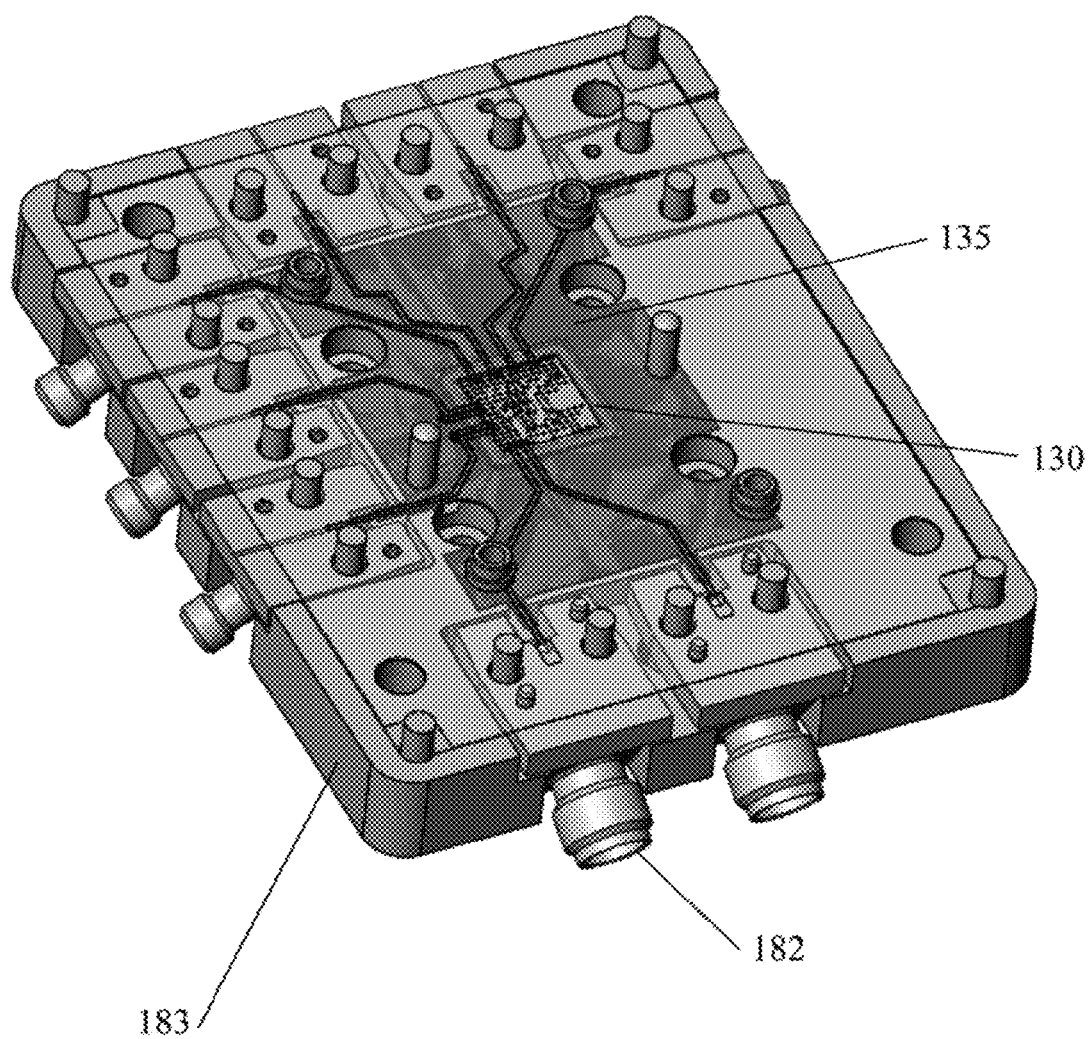
FIG. 15 illustrates a portion of a test socket assembly as constructed in one or more embodiments.
Figure 16:
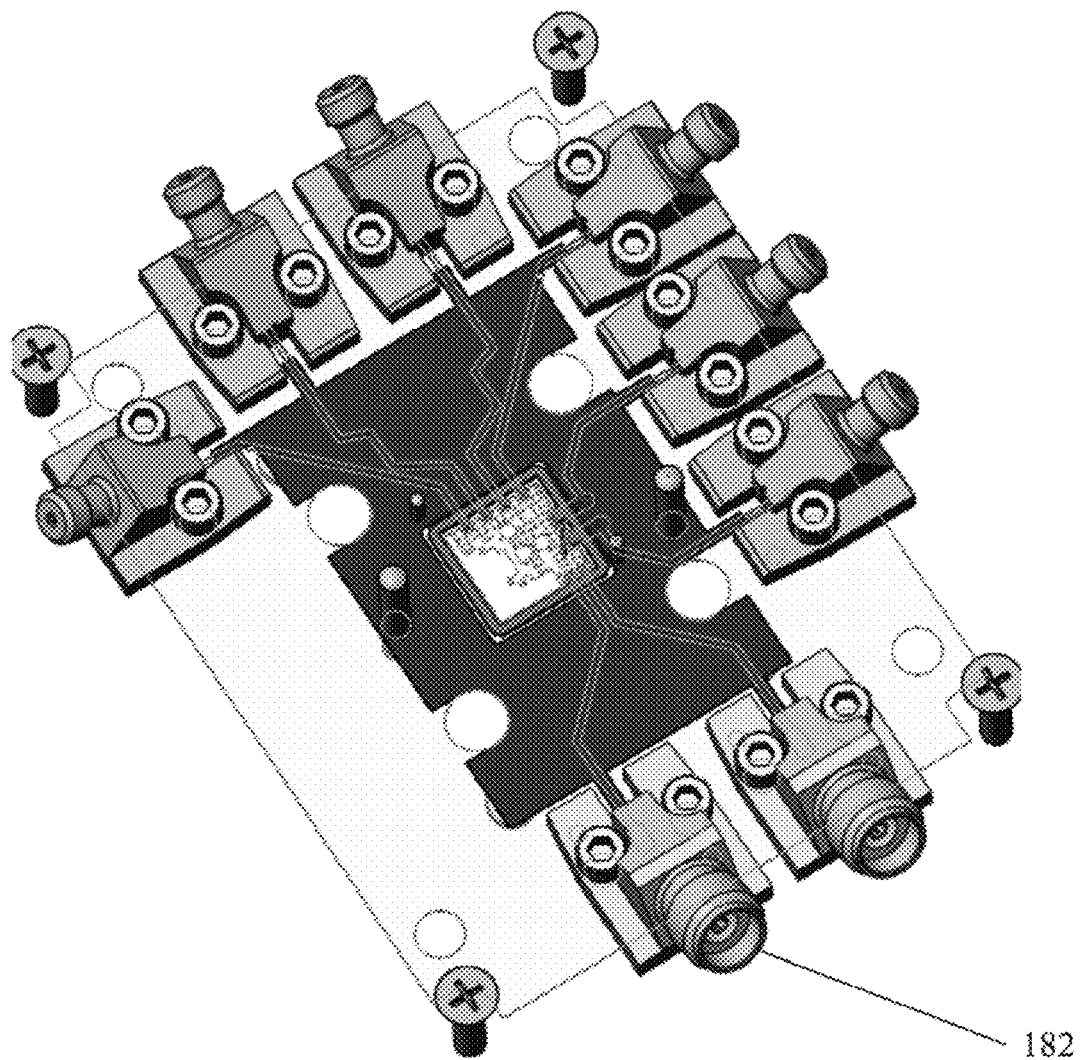
FIG. 16 illustrates a portion of a test socket assembly as constructed in one or more embodiments.

In one or more embodiments, the leadframe microwave structures are terminated externally to precision microwave coaxial connectors. In one or more embodiments, the leadframe is impedance matched at the transition to the coaxial connectors 182 (FIG. 12) for optimal RF performance. The leadframe can include a flat configuration with axially terminating connectors (FIG. 12, FIG. 13A). In one or more embodiments, the leadframe has a gradual radius downward, so that coaxial connectors can be mounted below the socket housing, allowing for improved socket density in test handling conditions (FIG. 6).

Several options for the signal lines are as follows. For instance, in one or more embodiments, the leadframe signal lines are configured in a coplanar waveguide transmission line structure. In one or more embodiments, the leadframe signal lines can be split with a balun structure, so that the split signals shift phase to a prescribed amount at a prescribed frequency. This allows for construction of a balanced differential signal pair. In one or more embodiments, the leadframe signal lines can incorporate loopback structures that are short and connect an input and output signal of a device under test for testing. In addition, in one or more embodiments, leadframe signal lines can be lengthened or shortened to add a prescribed signal delay.

The socket frame 180 is shown in FIG. 12 in greater detail. The coplanar waveguide transmission line structures terminate to a coaxial feed through connector or surface mounted connector, in one or more embodiments. A reduced diameter of the center conductor of the connector mates with a recess and/or slot in an end of the leadframe assembly 140 lead. An electrical connection can be made, for example, by soldering the connection. A ground plane of the lead frame assembly 140 has protrusions near the signal line, and the protrusions are inserted into holes in a conductor frame, for example, a metal frame, that encloses the entire socket and supports the coaxial connectors. In one or more embodiments, the ground plane can be mechanically attached, such as clamped with metal fasteners. This connection can be used to connect all of the ground planes to the socket body. In one or more embodiments, a transition from the lead frame signal line to the coaxial connector is matched so that impedance discontinuities are minimized for high speed performance.

Referring to FIGS. 13A-D, in one or more embodiments, the socket assembly has an outer body constructed of a conductive metal shell. The shell acts as a mounting point for connectors and acts as an electrical ground. The socket assembly further includes a socket body 110 that is non-conductive and houses the spring probes (FIG. 1). The spring probes contact digital signals, power, and ground pins on the device under test. A retainer plate on the bottom of the body 110 captivates the spring probes.

FIGS. 14-17 illustrate a use of a surface mount connector as terminations for the microwave transmission lines. This construction allows for a non-conductive socket housing 183, such as a plastic housing, to be used. The above-discussed embodiments are incorporated herein for FIGS. 14-17.

Figure 17:
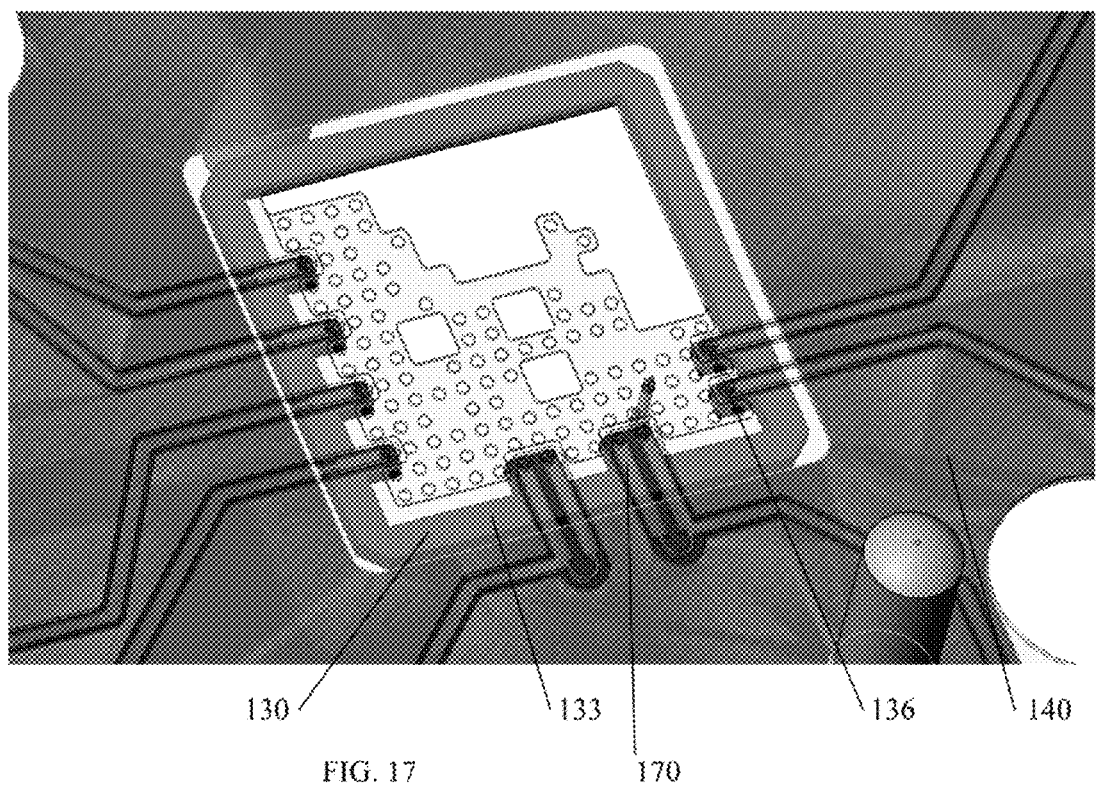
FIG. 17 illustrates a portion of a test socket assembly as constructed in one or more embodiments.

As shown in FIG. 17, the leadframe assembly 140 includes an electrically conductive sheet with holes, slots, and cantilever members 150, and balun structure 170 that make the impedance controlled microwave structures (such as a coplanar waveguide). Microwave structures are formed to high speed signal positions of the device under test, and are routed to the edge of the leadframe assembly 140 or to an interior position in the grounding portion of the leadframe. On a back side of the leadframe is a thin, flexible polymer 135, which can be attached with an adhesive, to maintain the shape and position of all of the individual leadframe parts.

An elastomer spacer 130 is provided, where the leadframe assembly 140 is adjacent to the elastomer spacer 130. For example the leadframe assembly 140 is positioned on top of the elastomer spacer 130, and in a further option positioned directly adjacent and directly on top of the spacer 130. The elastomer spacer 130 is disposed in a pocket in the plastic socket body. The elastomer spacer 130 provides resiliency to the cantilever members 150 at the end of the signal leads. In one or more embodiments, the elastomer spacer 130 has an outer frame 133, and spacer fingers 136 extending into a center opening of the spacer 130. In one or more embodiments, the elastomer spacer 130 is resilient so that the microwave structures and ground planes offer compliance. In one or more embodiments, the spacer fingers 136 support the cantilever members 150.

In one or more embodiments, the leadframe microwave structures are terminated externally to precision microwave coaxial connectors. In one or more embodiments, the leadframe is impedance matched at the transition to the coaxial connectors 182 for optimal RF performance. The coaxial connectors 182 can be surface mounted to the lead frame. In one or more embodiments, the outside perimeter of the lead assembly includes the ground plane, however it is not necessary to interface every pin with the ground plane.

During use of the socket assembly, a method for testing components includes disposing a device under test in a socket assembly, the socket assembly comprising a housing having one or more spring probes therein, a leadframe assembly including one or more cantilever members, the leadframe assembly having impedance controlled microwave structures and a flexible ground plane, the leadframe assembly disposed within the housing, and an elastomeric spacer adjacent the leadframe assembly. The method further includes contacting the device under test with the spring probes and the microwave structures, contacting the device under test with the cantilever members and flexing and deflecting the cantilever members, resiliently supporting the cantilever members with the elastomeric spacer, and sending microwave signals to and from the device under test.

In one or more embodiments, the leadframe assembly includes a first set of holes and a second set of holes, and the spring probes electrically contact the first set of holes and ground signals are tested. In one or more embodiments, the method further includes penetrating a portion of the device under test with the cantilever members.

The socket assembly is a test socket that is compatible with semiconductor back-end manufacturing, yet is capable in operating at the W-band frequencies. The spring probes provide for reliable testing and are combined with impedance matched transmission line contacts to device contact points.

It is to be understood that the above description is intended to be illustrative, and not restrictive. Many other embodiments will be apparent to those of skill in the art upon reading and understanding the above description. It should be noted that embodiments discussed in different portions of the description or referred to in different drawings can be combined to form additional embodiments of the present application. The scope should, therefore, be determined with reference to the appended claims, along with the full scope of equivalents to which such claims are entitled.

The invention claimed is:

1. A socket assembly comprising:
    a housing having one or more spring probes therein;
    a leadframe assembly including one or more cantilever members, the leadframe assembly having impedance controlled microwave structures and a flexible ground plane, the leadframe assembly disposed within the housing; and
    an elastomeric spacer adjacent the leadframe assembly and supporting the cantilever members, the elastomeric spacer receiving the spring probes therethrough.

2. The socket assembly as recited in claim 1, wherein the housing has a pocket therein, and the elastomeric spacer is received in the pocket.

3. The socket assembly as recited in claim 1, wherein the leadframe assembly has a first set of holes and a second set of holes therein, the first set of holes in electrical contact with the probes, and the second set of holes is not in electrical contact with the probes.

4. The socket assembly as recited in claim 3, wherein the first set of holes and the second set of holes each receive the spring probes therethrough.

5. The socket assembly as recited in claim 1, wherein the elastomeric spacer is resilient to the ground and microwave structures.

6. The socket assembly as recited in claim 1, wherein the leadframe assembly has signal lines, and the signal lines are in an coplanar waveguide transmission line structure.

7. The socket assembly as recited in claim 1, wherein the leadframe assembly has signal lines, and the signal lines include loopback structures, the loopback structures are configured to connect to an input and output of a device under test for testing.

8. The socket assembly as recited in claim 1, wherein the cantilever members include coupling members of the transmission line signals.

9. The socket assembly as recited in claim 8, wherein the coupling members are delay lines.

10. The socket assembly as recited in claim 8, wherein the coupling members are phase shifting lines.

11. A socket assembly comprising:
a housing having one or more spring probes therein;
a leadframe assembly including one or more cantilever members, the leadframe assembly having impedance controlled microwave structures and a flexible ground plane, the leadframe assembly disposed within the housing;
an elastomeric spacer adjacent the leadframe assembly and supporting the cantilever members, the elastomeric spacer receiving the spring probes therethrough; and
an outer metal housing having one or more mounting connectors, where the lead frame assembly is disposed within the outer metal housing.

12. A socket assembly comprising:
a housing having one or more spring probes therein;
a leadframe assembly including one or more cantilever members, the leadframe assembly having impedance controlled microwave structures and a flexible ground plane, the leadframe assembly disposed within the housing;
an elastomeric spacer adjacent the leadframe assembly and supporting the cantilever members, the elastomeric spacer receiving the spring probes therethrough; and
an outer plastic housing, the lead frame assembly is disposed within the plastic housing and having surface-mount connectors are positioned directly on the leadframe assembly.

13. A socket assembly comprising:
a housing having one or more spring probes therein;
a leadframe assembly including one or more cantilever members, the leadframe assembly having impedance controlled microwave structures and a flexible ground plane, the leadframe assembly disposed within the housing;
an elastomeric spacer adjacent the leadframe assembly and supporting the cantilever members, the elastomeric spacer receiving the spring probes therethrough; and
wherein the leadframe assembly has signal lines, and the signal lines are split with a balun structure resulting in split signals, and the split signals shift phase to a prescribed amount at a prescribed frequency.

14. A method for testing components comprising:
disposing a device under test in a socket assembly, the socket assembly comprising a housing having one or more spring probes therein, a leadframe assembly including one or more cantilever members, the leadframe assembly having impedance controlled microwave structures and a flexible ground plane, the leadframe assembly disposed within the housing, and an elastomeric spacer adjacent the leadframe assembly;
contacting the device under test with the spring probes and the microwave structures;
contacting the device under test with the cantilever members and flexing and deflecting the cantilever members;
resiliently supporting the cantilever members with the elastomeric spacer;
and
sending microwave signals to and from the device under test.

15. The method as recited in claim 14, wherein the leadframe assembly includes a first set of holes and a second set of holes, and the spring probes electrically contact the first set of holes and ground signals are tested.

16. The method as recited in claim 14, further comprising penetrating a portion of the device under test with the cantilever members.

17. A socket assembly comprising:
a housing having one or more spring probes therein;
a leadframe assembly including one or more cantilever members, the leadframe assembly having impedance controlled microwave structures and a ground plane, the leadframe assembly disposed within the housing;
a spacer adjacent the leadframe assembly and supporting the cantilever members, the spacer receiving the spring probes therethrough; and
wherein the leadframe assembly has signal lines, and the signal lines include loopback structures, the loopback structures are configured to connect to an input and output of a device under test for testing.

18. A socket assembly comprising:
a housing having one or more spring probes therein;
a leadframe assembly including one or more cantilever members, the leadframe assembly having impedance controlled microwave structures and a ground plane, the leadframe assembly disposed within the housing;
a spacer adjacent the leadframe assembly and supporting the cantilever members, the spacer receiving the spring probes therethrough; and
wherein the leadframe assembly has split signal lines having split signals, and the split signals shift phase to a prescribed amount at a prescribed frequency.

19. The socket assembly as recited in claim 18, wherein the leadframe assembly has signal lines, and the signal lines include loopback structures, the loopback structures are configured to connect to an input and output of a device under test for testing.

20. A method for testing components comprising:
disposing a device under test in a socket assembly, the socket assembly comprising a housing having one or more spring probes therein, a leadframe assembly including one or more cantilever members, the leadframe assembly having impedance controlled microwave structures and a flexible ground plane, the leadframe assembly disposed within the housing, and an elastomeric spacer adjacent the leadframe assembly, wherein the leadframe assembly includes signal lines with loopback structures, connecting an input and output of the device under test for testing;

contacting the device under test with the spring probes and the microwave structures;

contacting the device under test with the cantilever members and flexing and deflecting the cantilever members;

resiliently supporting the cantilever members with the elastomeric spacer; and sending microwave signals to and from the device under test.

21. The method as recited in claim 20, further comprising splitting the signal lines and creating split signals.

22. The method as recited in claim 21, further comprising shifting phase of the split signals to a prescribed amount at a prescribed frequency.

* * * * *